United States Patent
Lee et al.

(10) Patent No.: US 7,059,731 B2
(45) Date of Patent: Jun. 13, 2006

(54) COMPACT LED MODULE AND PROJECTION DISPLAY ADOPTING THE SAME

(75) Inventors: Young-chol Lee, Gyeonggi-do (KR); Yasunori Kuratomi, Gyeonggi-do (KR); Dong-ha Kim, Gyeonggi-do (KR); Il-kweon Moon, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 63 days.

(21) Appl. No.: 10/835,599

(22) Filed: Apr. 30, 2004

(65) Prior Publication Data

US 2005/0018147 A1 Jan. 27, 2005

Related U.S. Application Data

(60) Provisional application No. 60/477,035, filed on Jun. 10, 2003.

(30) Foreign Application Priority Data

Sep. 16, 2003 (KR) .................. 10-2003-0064207
Mar. 18, 2004 (KR) .................. 10-2004-0018284

(51) Int. Cl.
| G03B 21/14 | (2006.01) |
| G03B 21/28 | (2006.01) |
| G02B 6/10 | (2006.01) |
| G01D 11/28 | (2006.01) |
| F21V 7/04 | (2006.01) |

(52) U.S. Cl. .................. 353/99; 353/97; 385/901; 385/146; 362/26; 362/551

(58) Field of Classification Search ............ 353/97–98, 353/94, 99; 385/901, 146; 362/26, 551, 362/582; 313/372, 475
See application file for complete search history.

(56) References Cited

U.S. PATENT DOCUMENTS 5,146,248 A * 9/1992 Duwaer et al. ............. 353/122
2002/0071274 A1* 6/2002 Chuang ..................... 362/237

FOREIGN PATENT DOCUMENTS

| JP | 2001-42431 A | 2/2001 |
| JP | 2003-317513 A | 11/2003 |
| KR | 2000-0029362 A | 5/2000 |
| KR | 2003-0028479 A | 4/2003 |

* cited by examiner

Primary Examiner—W. B. Perkey
Assistant Examiner—Magda Cruz
(74) Attorney, Agent, or Firm—Sughrue Mion, PLLC

(57) ABSTRACT

A compact light source module includes a compact light source and a collimator that includes a parabolic first reflective surface to reduce a radiation angle at which a light beam radiates from the compact light source, so as to emit the light beam through a side aperture and a plane second reflective surface which is located under the first reflective surface and comprises an incident portion through which the light beam radiates from the compact light source. The compact light source is located in the vicinity of a focal point of the first reflective surface.

26 Claims, 15 Drawing Sheets

COMPACT LED MODULE AND PROJECTION DISPLAY ADOPTING THE SAME

BACKGROUND OF THE INVENTION

This application claims the priority of Korean Patent Application Nos. 2003-64207 and 2004-18284 filed in the Korean Intellectual Property Office on Sep. 16, 2003, and Mar. 18, 2004, respectively, and U.S. Provisional Patent Application No. 60/477,035 filed in the United States Patent and Trademark Office on Jun. 10, 2003, the disclosures of which are incorporated herein in their entirety by reference.

1. Field of the Invention

Apparatuses consistent with the present invention relate to a compact light source module and a projection display adopting the compact light source module and, more particularly, to a compact light source module using a light source such as a light emitting diode and a projection display adopting the compact light source module.

2. Description of the Related Art

FIG. 1 shows the structure of a conventional projection display. Referring to FIG. 1, the conventional projection display includes liquid crystal display (LCD) panels 20R, 20G, and 20B which are optical modulators, an illumination unit 10 which irradiates light onto the LCD panels 20R, 20G, and 20B, and a projection lens 40 which magnifies and projects a modulated image.

The LCD panels 20R, 20G, and 20B modulate red (R), green (G), and blue (B) beams, respectively, to be suitable for respective image data so as to display a color image. Reference numeral 30 denotes a synthesizing prism which combines the modulated R, G, and B beams and then irradiates the combined beam onto the projection lens 40.

The illumination unit 10 includes a light source 1, an integrator 3, a condenser lens 4, a plurality of mirrors 5R, 5G, and 5B, and a plurality of relay lenses 7 and 8.

The light source 1 may be a metal halide lamp or a super-high voltage mercury lamp and is located at a focal point of a reflective mirror 2 with a parabolic surface. The integrator 3 is used to irradiate a uniform beam onto the LCD panels 20R, 20G, and 20B and generally made of two fly-eye lenses in which micro-lenses are two-dimensionally arrayed. A light beam, which has passed through the integrator 3, is condensed by the condenser lens 4. The mirrors 5R, 5G, and 5B are selective reflector mirrors which reflect the R, G, and B beams, respectively, and transmit other color beams. A light beam is split into the R, G, and B beams via the mirrors 5R, 5G, and 5B, respectively, and then the R, G, and B beams are incident on the LCD panels 20R, 20G, and 20B, respectively, through the relay lenses 7 and 8. The LCD panels 20R, 20G, and 20B modulate the R, G, and B beams, respectively, so as to output R, G, and B color images. The synthesizing prism 30 combines the R, G, and B beams output from the LCD panels 20R, 20G, and 20B into one, and then the projection lens 40 magnifies and projects the combined beam.

However, in such a conventional projection display, a lamp is used as a light source to illuminate optical modulators and has a short life span. Therefore, when the conventional projection display is used at homes, the lamp should be frequently replaced with new one. Also, the light source is a large size. In order to solve these problems, studies on the use of compact light sources such as a light emitting diode (LED) with a relatively long life span, etc. are in progress. Japanese Patent Publication No. JP 2001-42431 discloses a projection device using an LED.

FIG. 2 shows the LED structure of a Luxeon Emitter manufactured by LUMILEDS Company. Referring to FIG. 2, a dome lens 62 as one of primary optics is installed over an LED chip 61. The dome lens 62 condenses a light beam emitted from LED chip 61.

The light beam, which has passed through the dome lens 62, has a light intensity distribution as denoted by reference character C1 or C2 of FIG. 3. In a graph of FIG. 3, the widthwise axis denotes a radiation angle and the lengthwise axis denotes a relative intensity of light. The light intensity distributions C1 and C2 are wing-shaped and gently dome-shaped, respectively, within the radiation angle between 0° and ±90°. However, the radiation angle should be between 0° and ±15° to illuminate the optical modulators 20R, 20G, and 20B. Therefore, a light beam with a light intensity distribution above the radiation angle between 0° and ±15°, i.e., a portion of the light beam with the light intensity distribution C1 or C2 above the radiation angle between 0° and ±15°, fails to illuminate the optical modulators 20R, 20G, and 20B and thus is lost. As a result, light efficiency deteriorates.

To prevent such loss of light, the conventional projection display includes secondary optics which condenses a light beam emitted from an LED before irradiating the light beam onto the optical modulators 20R, 20G, and 20B so that the light beam has a light intensity distribution as denoted by reference character C3 of FIG. 3. As a result, the additional use of the secondary optics makes an illumination system of the conventional projection display complicated and increases cost of manufacturing the illumination system.

In general, an LED emits a smaller amount of light than a metal halide lamp or a super-high voltage mercury lamp. Thus, the conventional projection display uses an array of LEDs as a light source. In this case, secondary optics is necessary. However, since the secondary optics has to be lenses, light condensing efficiency deteriorates. This will be explained in more detail with reference to FIGS. 4A and 4B.

In a paraxial area, the product of the size and angle of an image is conserved. Thus, the product of the emission area of an LED and the steradian of the emission angle of the LED is a conservation value which is called an "etendue". When the etendue is less than the product of the area of a LCD panel and a steradian calculated from an F value of a projection lens, the light condensing efficiency increases.

As shown in FIG. 4A, when one LED is used, the product of the emission area $\Phi_L$ and the steradian $U_L$ of the LED may be equal to the product of the emission area $\Phi_L$ and the steradian $U_P$ of the LCD panel.

As shown in FIG. 4B, when an array of LEDs is used, the emission area $\Sigma\Phi_L$ of the array of LEDs is larger than the emission area $\Phi_L$ of the LED of FIG. 4A. Here, the steradian $U_L$ of the emission angle of the array of LEDs is equal to the steradian $U_L$ of the LED of FIG. 4A, and the emission area $\Phi_P$ of an LCD panel is equal to the emission area $\Phi_L$ of the LCD panel of FIG. 4A. Therefore, in order to conserve the etendue, the steradian $U_P'$ of the emission angle of the LCD panel of FIG. 4B is larger than the steradian $U_P$ of the LCD panel of FIG. 4A. Accordingly, when the array of LEDs as shown in FIG. 4B is used, light is lost, resulting in decreasing light condensing efficiency and the luminance of the projection display.

SUMMARY OF THE INVENTION

Apparatuses consistent with the present invention provide a compact light source module including a collimator to collimate a light beam emitted from a compact light source such as an LED so as to efficiently irradiate the light beam onto an object within the range of a radiation angle, and a projection display adopting the compact light source module.

According to a non-limiting, exemplary aspect of the present invention, there is provided a compact light source module including: a compact light source; and a collimator that includes a parabolic first reflective surface to reduce a radiation angle at which a light beam radiates from the compact light source, so as to emit the light beam through a side aperture and a second reflective surface which is located under the first reflective surface and includes an incident portion through which the light beam radiates from the compact light source. The compact light source is located in the vicinity of a focal point of the first reflective surface.

The invention also contemplates a reflective index matching member disposed between the compact light source and the collimator. A reflective index of the reflective index matching member is smaller than that of the compact light source and greater than that of the collimator.

According to another aspect of the present invention, there is provided a projection display including an illumination unit, an optical modulator to modulate a light beam radiating from the illumination unit to be suitable for image data, and projection optics to magnify and project the light beam emitted from the optical modulator. The illumination unit includes at least one compact light source module. The at least one compact light source module includes a compact light source and a collimator including a parabolic first reflective surface to reduce a radiation angle at which a light beam radiates from the compact light source, so as to emit the light beam through a side aperture and a plane second reflective surface which is located under the first reflective surface and includes an incident portion through which the light beam radiates from the compact light source. The compact light source is located in the vicinity of a focal point of the first reflective surface.

According to still another aspect of the present invention, there is provided a compact light source module including: a compact light source; and a collimator including a parabolic first reflective surface to reduce a radiation angle at which a light beam radiates from the compact light source, so as to emit the light beam through a side aperture. The compact light source is located in the vicinity of a focal point of the first reflective surface.

According to yet another aspect of the present invention, there is provided a projection display including an illumination unit, an optical modulator to modulate a light beam radiating from the illumination unit to be suitable for image data, and projection optics to magnify and project the light beam emitted from the optical modulator. The illumination unit includes: a compact light source; and a collimator including a parabolic first reflective surface to reduce a radiation angle at which a light beam radiates from the compact light source, so as to emit the light beam through a side aperture. The compact light source is located in the vicinity of a focal point of the first reflective surface.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF ILLUSTRATIVE NON-LIMITING EMBODIMENTS OF THE INVENTION

Figure 1:
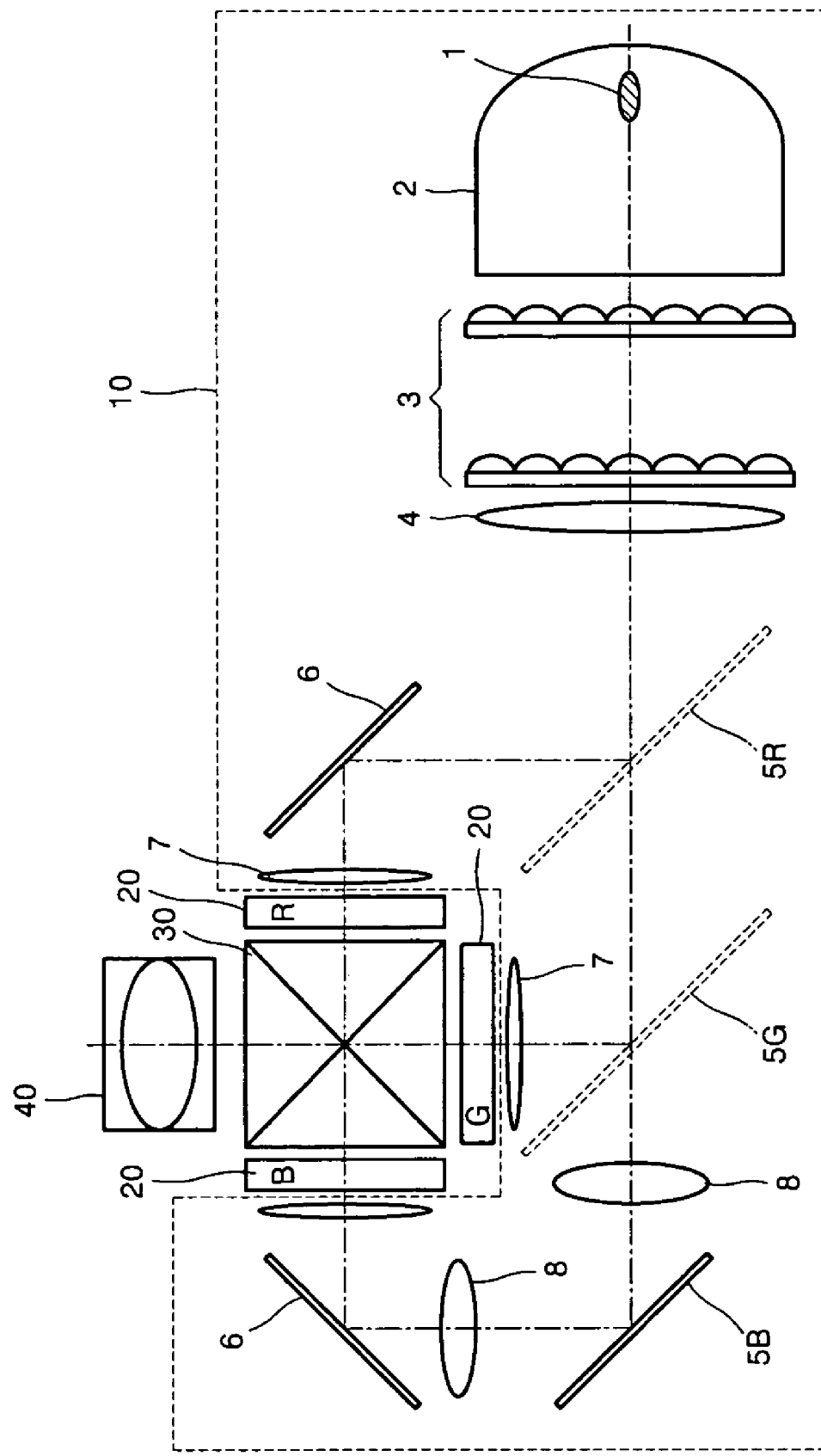
FIG. 1 is a view showing the structure of a conventional projection display.

Hereinafter, illustrative, non-limiting embodiments of the present invention will be described in detail with reference to the attached drawings. Like reference numerals refer to like elements throughout.

Figure 2:
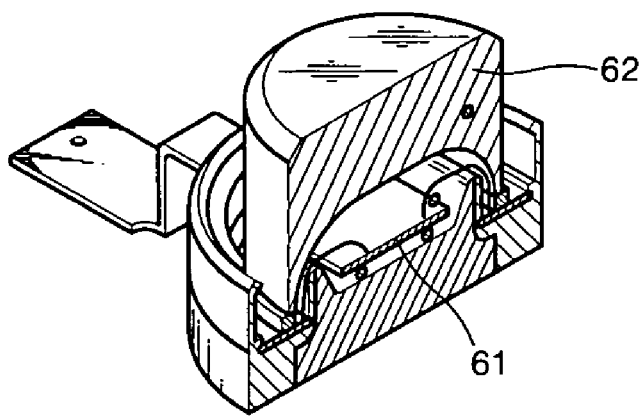
FIG. 2 is a schematic view showing the structure of a conventional LED.
Figure 5:
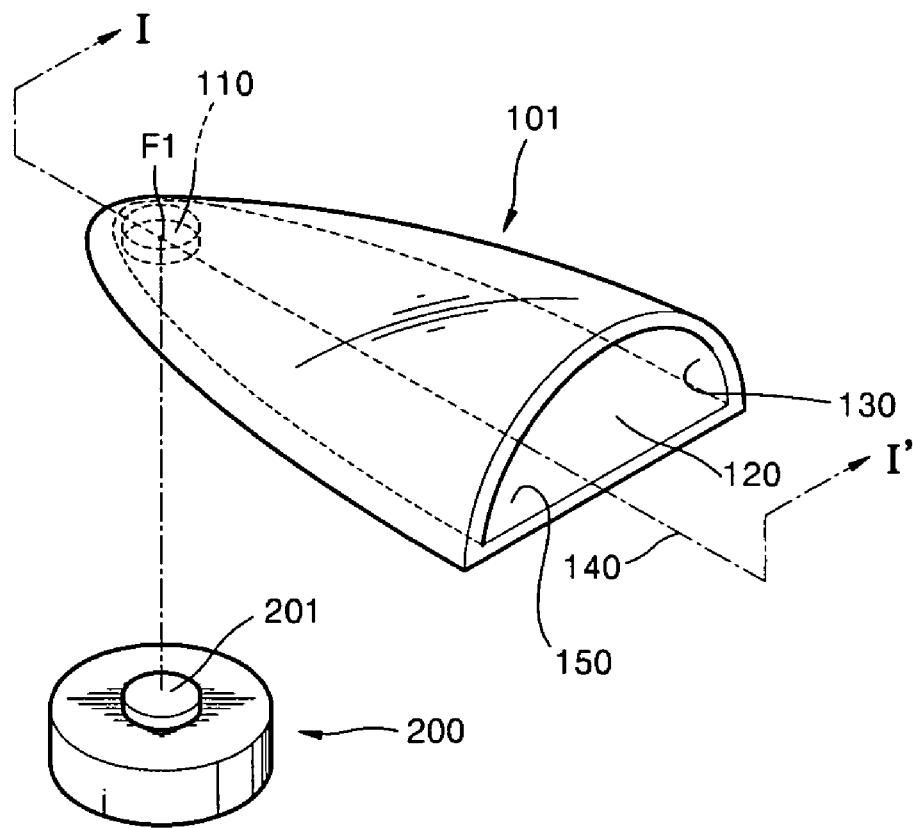
FIG. 5 is an exploded perspective view of a compact light source module, according to an embodiment of the present invention.
Figure 6:
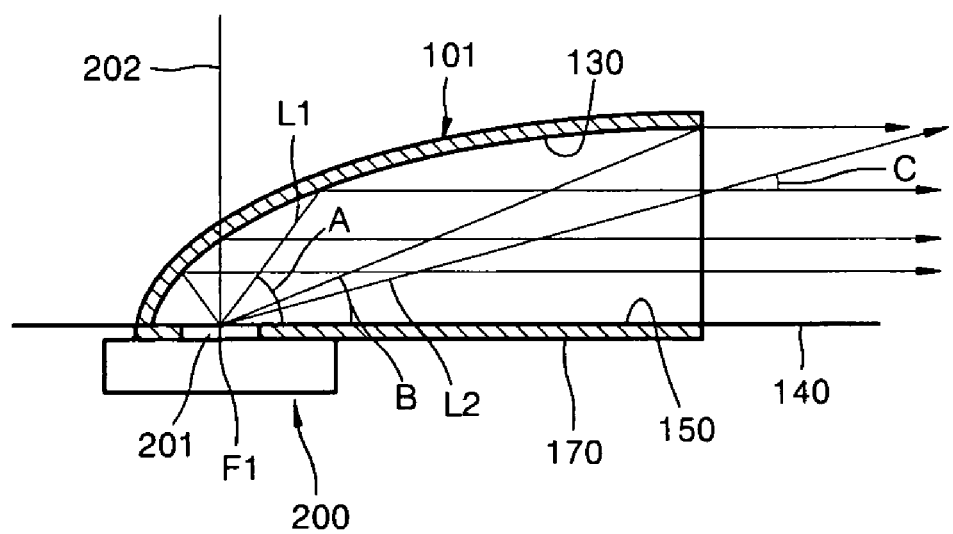
FIG. 6 is a cross-sectional view taken along line I–I' of FIG. 5.

FIG. 5 is an exploded perspective view of a compact light source module, according to an embodiment of the present invention, and FIG. 6 is a cross-sectional view taken along line I–I' of FIG. 5. Referring to FIGS. 5 and 6, an LED 200 is used as the compact light source. A collimator 101 is prepared on the LED 200. The LED 200 includes an LED chip 201 which emits a light beam. Although not shown, the LED 200 further includes a heat emitter which emits heat generated from the LED chip 201, and an anode and a cathode which supply the LED chip 201 with a current. In the present embodiment, the LED 200 does not include the dome lens 62 of FIG. 2. This does not limit the scope of the present invention. The structure of the LED 200 is well known to one of ordinary skill in the art and thus is not explained herein.

The collimator 101 has a side aperture 120. A first reflective surface 130 and a second reflective surface 150 to reflect light beams are prepared on the inner surface of the collimator 101. The first reflective surface 130 is parabolic.

The second reflective surface 150 is located under the first reflective surface 130, and includes an incident portion 110 through which a light beam radiates from the LED 200. In this embodiment, preferably but not necessarily, the second reflective surface 150 is plane. For example, as shown in FIGS. 5 and 6, the incident portion 110 may penetrate through a panel 170 on which the second reflective surface 150 is formed.

As described above, the first reflective surface 130 is defined to have a parabolic shape. The term "parabolic" denotes not only a strict parabolic shape whose conic coefficient K is 1, but also an aspherical shape whose conic coefficient K is in the range of −0.4 to −2.5, preferably, −0.7 to −1.6. The conic coefficient K for the first reflective surface 130 can be adequately determined as any value in the aforementioned range so that light emitted from a compact light source is collimated to have a radiation angle range that enables the light to effectively illuminate an object. An example where the first reflective surface 130 has a strict parabolic shape whose conic coefficient K is 1 will now be described.

The LED 200 is arranged so that the LED chip 201 is located in the vicinity of a focal point F1 of the first reflective surface 130. It is preferable that the LED 200 is arranged so that its optical axis 202 is almost perpendicular to a principal axis 140. However, the present invention is not restricted thereto.

Referring to FIG. 6, light beams radiate from the LED 200 at radiation angle A between 0° and 180° and are incident on the first reflective surface 130. In the present embodiment, the radiation angle A is defined counterclockwise from the principal axis 140, and the first reflective surface 130 is parabolic. Thus, a light beam L1 radiates at a greater radiation angle A than aperture angle B, and is reflected from the first reflective surface 130 to be parallel with the principal axis 140, and emitted through the side aperture 120. A light beam L2 radiates from the LED 200 at smaller radiation angle A than the aperture angle B and is not incident on the first reflective surface 130 but directly emitted through the side aperture 120. Thus, the light beam L2 is emitted through the side aperture 120 at emission angle C between 0° and the aperture angle B. As a result, the collimator 101 collimates a light beam, which radiates from the LED 200 at radiation angle A between 0° and 180°, so as to be emitted at the emission angle C between 0° and the aperture angle B. The aperture angle B may be adjusted with respect to an illumination angle at which a compact light source module is to illuminate an object.

In the present embodiment, it is assumed that the LED 200 is a point light source with a radiation point which radiates light beams via the focal point F1. However, the LED 200 is not exactly the point source but a surface light source with a predetermined radiation area. Therefore, the light beams radiating from the LED 200 may be regard as radiating in the vicinity of the focal point F1. As a result, a portion of light beams emitted from the LED 200 may be reflected from the first reflective surface 130 toward the second reflective surface 150 not toward the side aperture 120. The second reflective surface 150 serves to receive the beam portion from the first reflective surface 130 and then reflect the beam portion toward the side aperture 120 so as to improve light efficiency.

Figure 7:
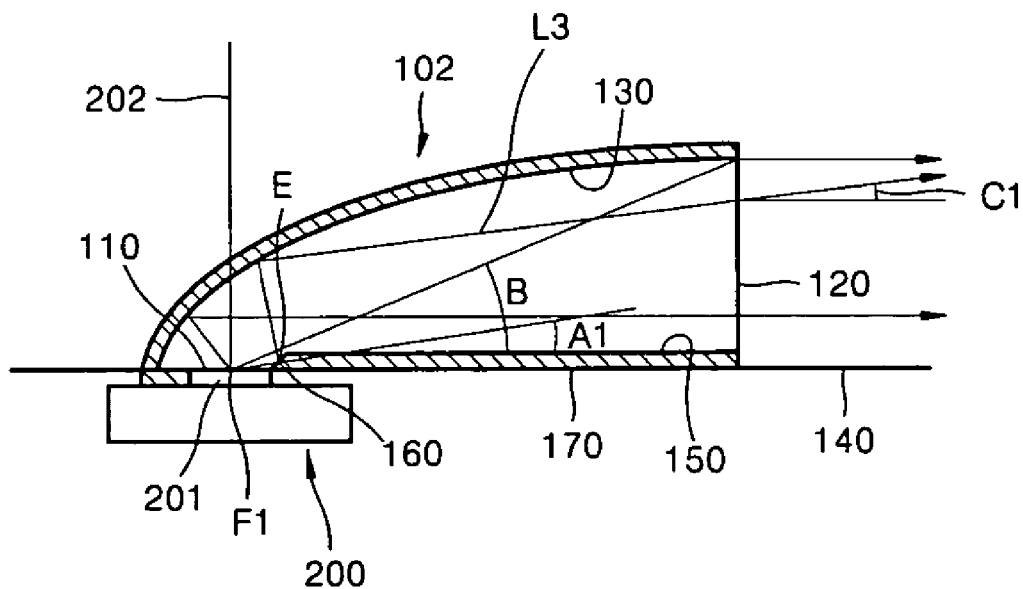
FIG. 7 is a cross-sectional view of a compact light source module, according to another embodiment of the present invention.

FIG. 7 is a cross-sectional view of a compact light source module, according to 102 further includes a third reflective surface 160. The third reflective surface 160 is formed at the edge of the incident portion 110 to reflect a light beam radiating at smaller radiation angle A than aperture angle B.

A light beam L3 radiates from the LED 200 at smaller radiation angel A1 than the aperture angle B and is reflected from the third reflective surface 160 toward the first reflective surface 130. Thus, although the light beam L3 radiates in the vicinity of the focal point F1 of the first reflective surface 130, the light beam L3 is regarded as radiating from point E intersecting the third reflective surface 160. Therefore, the light beam L3 is reflected from the first reflective surface 130 not to be parallel with the principal axis 140. However, the light beam L3 may be emitted at an emission angle C1 smaller than the initial radiation angle A1. As a result, light collimating efficiency can be improved.

In the present embodiment, the panel 170 is formed of a transparent material. In an exemplary embodiment, except for the incident portion 110 through which a light beam radiates from the LED 200, the inner or outer surfaces of the panel 170 are coated with a reflective material so as to form the second and third reflective surfaces 150 and 160. In general, when light beams travel from a medium with a high refractive index to a medium with a low refractive index, light beams radiating at greater incident angles than a critical angle are totally reflected due to a difference between the high and low refractive indexes. As the difference between the refractive indexes of the two media increases, a larger amount of light is totally reflected. The interior of the collimator 102 of FIG. 7 is filled with air. The panel 170 may be formed of transparent plastic or glass with a refractive index higher than air and lower than a material of which the LED chip 201 is made, so as to serve as a refractive index matching material which reduces a difference between the refractive indexes of the LED chip 201 and air.

Figure 8:
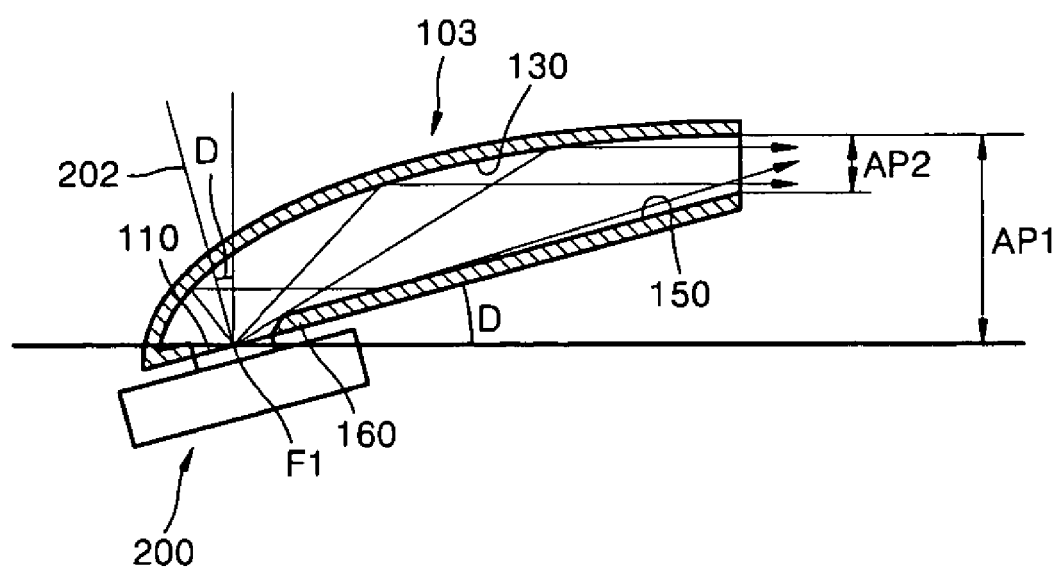
FIG. 8 is a cross-sectional view of a compact light source module, according to still another embodiment of the present invention.

FIG. 8 is a cross-sectional view of a compact light source module, according to still another embodiment of the present invention. Referring to FIG. 8, the second reflective surface 150 inclines with respect to the principal axis 140 of the first reflective surface 130 at angle D. The LED 200 is installed so that the optical axis 202 is substantially or almost perpendicular to the second reflective surface 150. As a result, the optical axis 202 of the LED 200 inclines with respect to the principal axis 140 of the first reflective surface 130 at the angle D. Due to this structure, the size of an aperture of a collimator 103 can be reduced. Reference character AP2 denotes the size of the aperture of the collimator 103. Reference character AP1 denotes the size of the apertures of the collimators 101 and 102 of FIGS. 5 and 7 in which the second reflective surface 150 is parallel with the principal axis 140. As shown in FIG. 8, the size AP2 of the aperture of the collimator 103 is smaller than the size AP1 of the apertures of the collimators 101 and 102. The reduction in the size of an aperture is advantageous to arraying a plurality of compact light source modules.

Meanwhile, the interiors of the collimators 101,102 and 103 shown in FIGS. 5 through 8 are filled with air. Thus, heat is generated when the LED 200 emits a light beam. However, heat may have a negative effect on the radiation characteristics of the LED 200.

Figure 9:
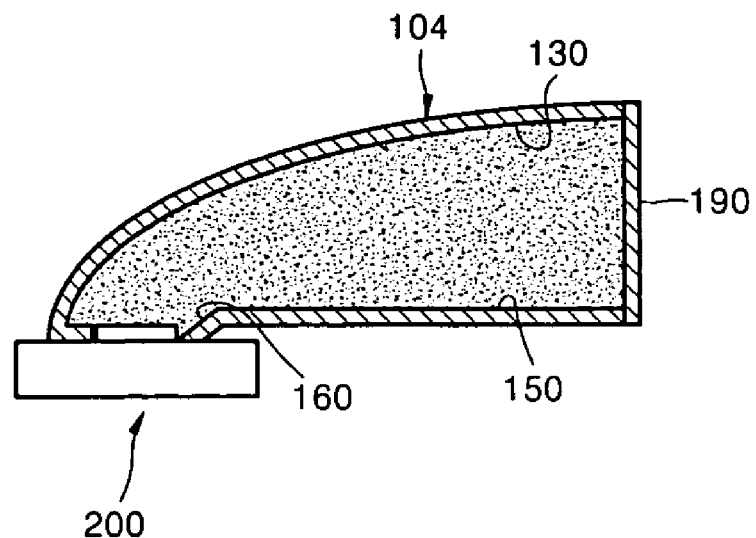
FIG. 9 is a cross-sectional view of a compact light source module, according to yet another embodiment of the present invention.

FIG. 9 is a cross-sectional view of a compact light source module, according to yet another embodiment of the present invention. Referring to FIG. 9, the interior of a collimator 104 is filled with a coolant. For this purpose, the LED 200 adheres to the collimator 104 so that the coolant leaks out of the collimator 104. A cover glass 190 may be installed at a side of the collimator 104 through which a light beam is emitted. The coolant may be benzene, glycerin, methyl alcohol, or the like.

Figure 10:
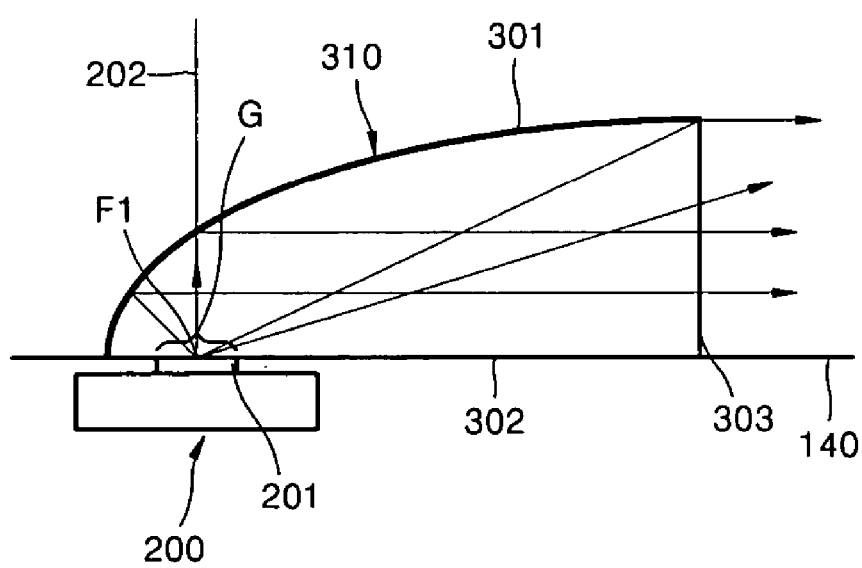
FIGS. 10 through 13 are cross-sectional views and a perspective view of compact light source modules using a transparent body, according to different embodiments of the preset invention.
Figure 11:
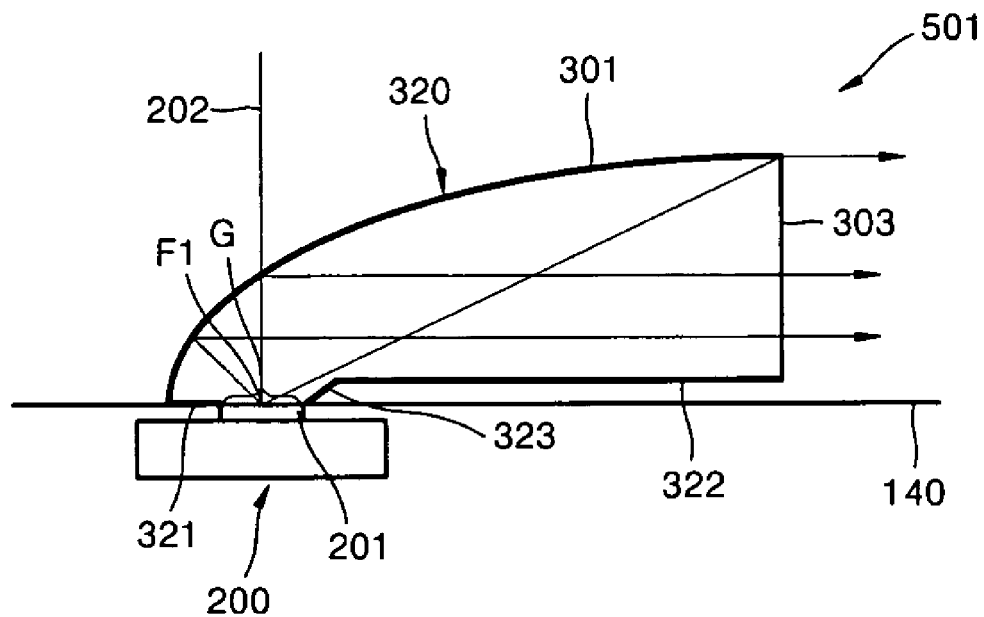
Figure 12:
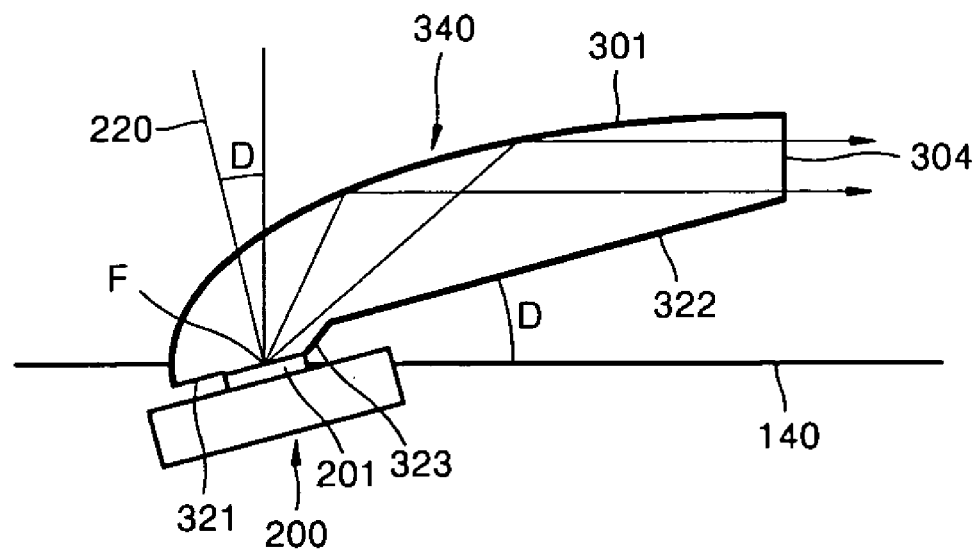

FIGS. 10 through 12 are cross-sectional views of compact light source modules, according to different embodiments of the present invention. These embodiments are characterized in that a collimator is formed of a transparent body.

Referring to FIG. 10, a transparent body 310 includes a parabolic outer surface 301, a plane lower surface 302, and a side surface 303. It is preferable, but not necessary, that the lower surface 302 includes a principal axis 140. The LED 200 is installed so that the LED chip 201 is located at a focal point F1 of the outer surface 301. The outer surface 301 is coated with a reflective material so as to serve the first reflective surface 130 to reflect light beams radiating from the LED 200. The lower surface 302 is coated with a reflective material expect area G through which the light beams radiate from the LED 200, so as to serve as the second reflective surface 150. The area G serves as the incident portion 110. Due to this structure, the transparent body 310 serves as the collimator 101 of FIG. 5. Hereinafter, the transparent body 310 is referred to as a collimator.

Referring to FIG. 11, a transparent body 320 includes the parabolic outer surface 301 and the plane side surface 303. A lower surface of the transparent body 320 includes first and second surfaces 321 and 322 with a step and an incline plane 323 which forms a boundary between the first and second surfaces 321 and 322. The outer surface 301 is coated with a reflective material so as to serve as the first reflective surface 130 to reflect light beams radiating from the LED 200. The first surface 321 is coated with a reflective material except the area G through which the light beams radiate from the LED 200. The second surface 322 and the incline plane 323 are also coated with a reflective material. The first and second surfaces 321 and 322 serve as the second reflective surface 150. The area G operates as the incident portion 110. The incline plane 323 functions as the third reflective surface 160 of FIG. 7. As a result, the transparent body 320 operates as the collimator 102 of FIG. 7. Hereinafter, the transparent body 320 is referred to as a collimator.

Referring to FIG. 12, a collimator 340 has the same structure as the collimator 103 of FIG. 8 except that the collimator 340 is formed of a transparent body. The first and second surfaces 321 and 322 serve as the second reflective surface 150 and incline with respect to the principal axis 140 of the outer surface 301 at angle D. Thus, a side surface 304 of the collimator 340 is smaller than the side surfaces 303 of the collimators 310 and 320 of FIGS. 10 and 11.

Although not shown, a reflective index matching member may be disposed between the LED 200 and the collimators 310, 320, 330, 340 of FIGS. 10 through 13. A reflective index of the reflective index matching member is smaller than that of the LED 200 and greater than that of the collimators 310, 320, 330, 340.

Figure 13:
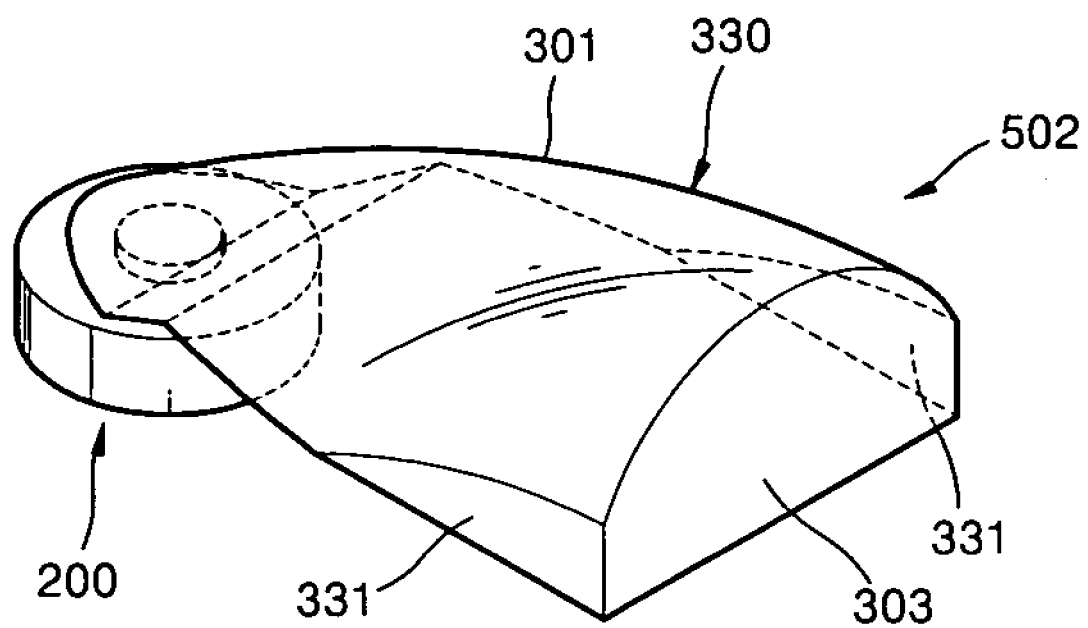

An array of compact light source modules may be used as a light source. Here, it is preferable, but not necessary, that a plurality of collimators adhere closely to one another. For this purpose, as shown in FIG. 13, a collimator 330, which includes the outer surface 301 with plane adherent surfaces 331 at its both sides, may be used. In a case where a compact light source module adopting the collimator 330 is used as a light source, nearly rectangular illumination light can be obtained. The adherent surfaces 331 are applicable to the collimators shown in FIGS. 5 through 12.

Figure 3:
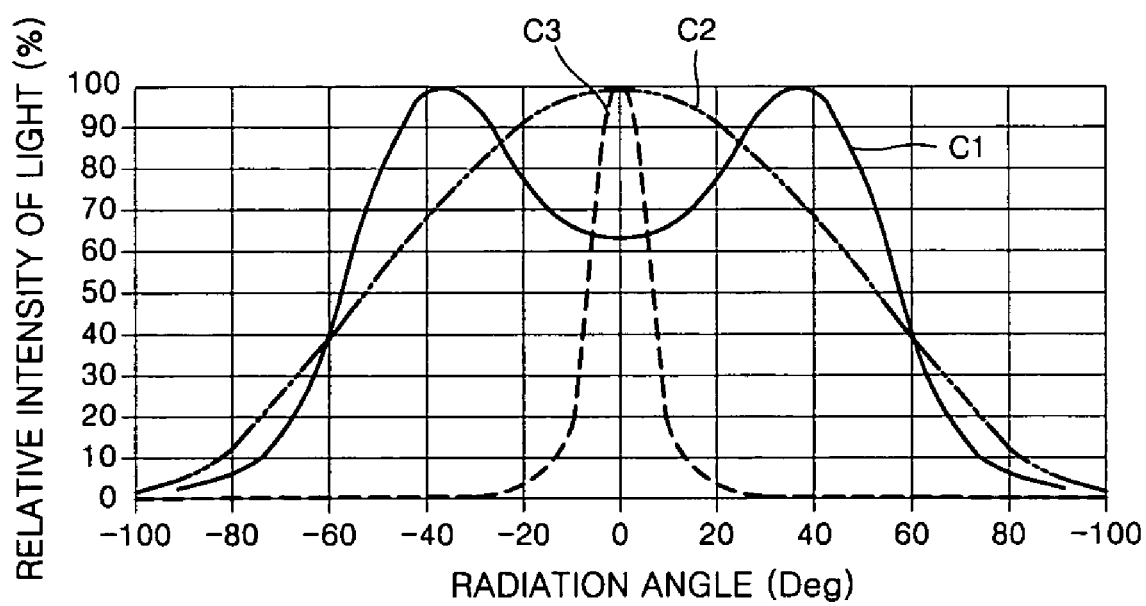
FIG. 3 is a graph showing the relationship between the radiation angle and light intensity of an LED.
Figure 4A:
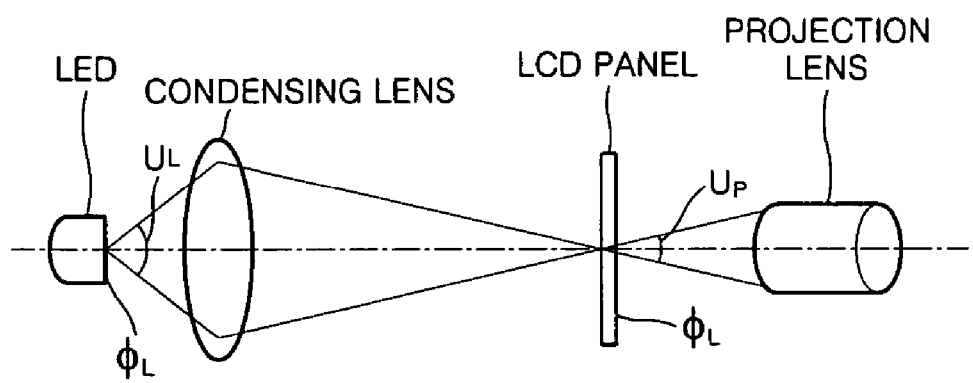
FIGS. 4A and 4B are views for explaining light condensing efficiency of an illumination system using a lens.
Figure 4B:
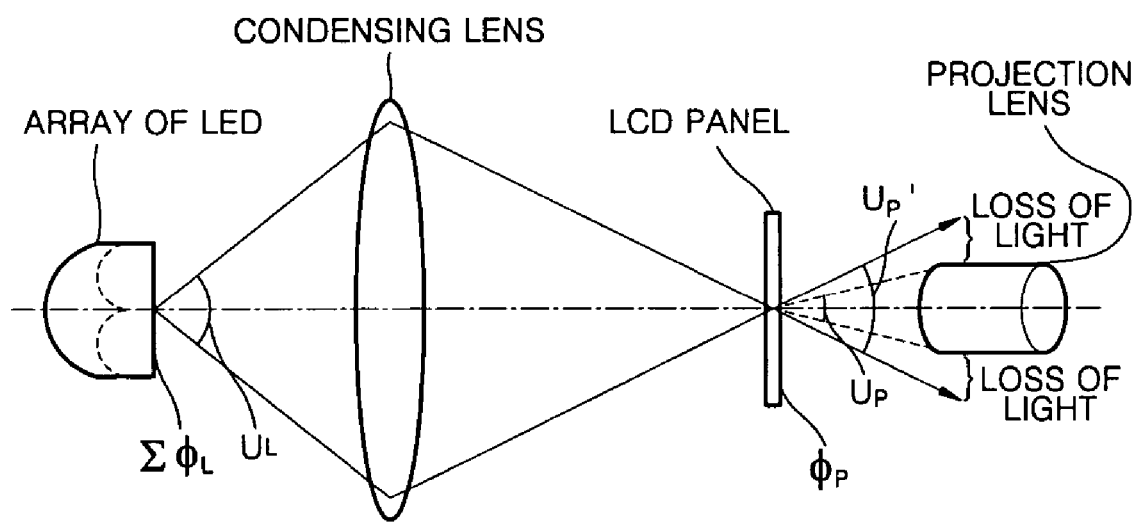
Figure 14:
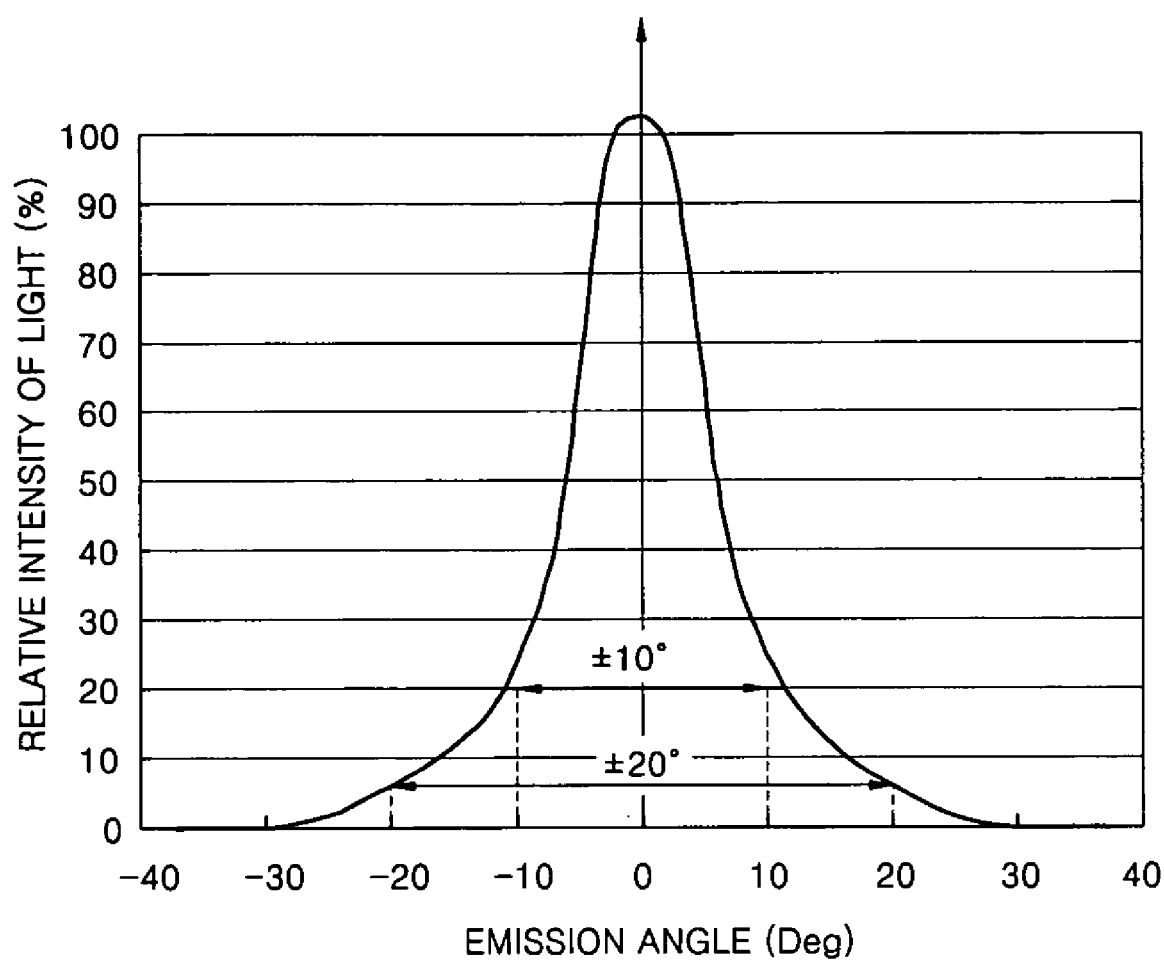
FIG. 14 is a graph showing the result of a simulation of a light intensity distribution with respect to an emission angle of a light beam emitted from the compact light source module of FIG. 11.

FIG. 14 is a graph showing the result of a simulation of the relative intensity of light with respect to an emission angle of a light beam emitted through the side surface 303 of the collimator 320 of FIG. 11. As can be seen in FIG. 14, the relative intensity of light is concentrated within the emission angle of ±20°. Collimating efficiency of the collimator 320 can be observed by comparing the relative light intensity of the present invention with the light intensity distributions C1 and C2 of the graph of FIG. 3.

As described above, a radiation angle of a light beam radiating from a compact light source can be changed into an angle at which a light beam is to be efficiently incident on an object. The change in the radiation angle results in improving light efficiency. In addition, when a compact light source module is used as a light source, secondary optics does not need to be installed in an illumination device. Thus, loss of light caused by the secondary optics can be prevented and the illumination device can be simplified.

Although it has been described in the above-described embodiments of the present invention that an LED is used as a compact light source, various types of light sources may be used. For example, various types of compact light sources such as an organic electric luminescent (EL) device, a laser, etc. may be used.

Figure 15:
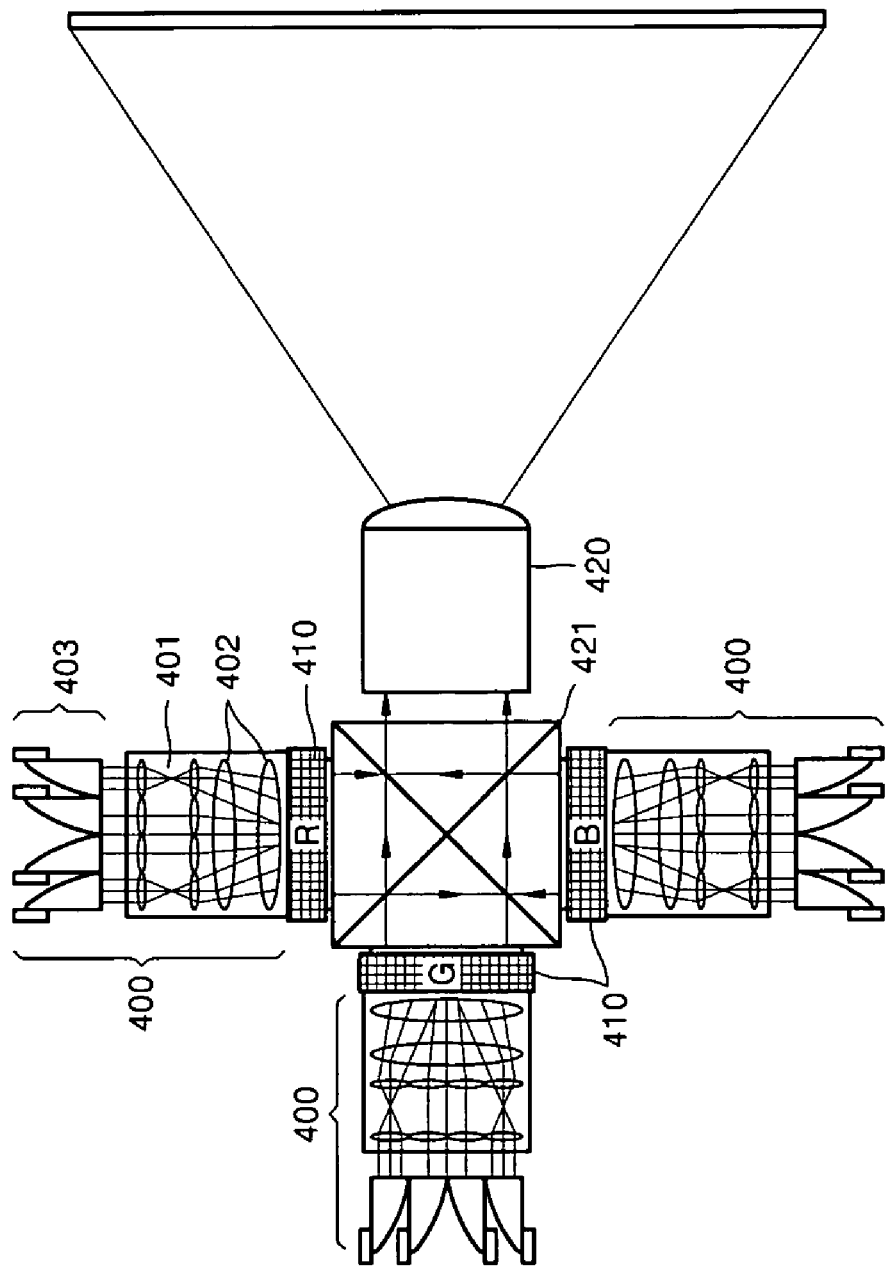
FIGS. 15 and 16 are schematic views showing the structures of projection displays using a transmissive optical modulator and a reflective optical modulator, respectively, according to embodiments of the presenting invention.

FIG. 15 is a schematic view of a projection display, according to an embodiment of the present invention. In general, an optical modulator to modulate illumination light to be suitable for image information is roughly classified into a transmissive optical modulator and a reflective optical modulator. In the present embodiment, the projection display adopts the transmissive optical modulator.

Referring to FIG. 15, the projection display includes LCD panels 410 which are used as transmissive optical modulators, illumination units 400 which illuminate the LCD panels 410, and projection optics 420 which magnifies and projects light beams modulate by the LCD panels 410. In the present embodiment, the projection display includes three LCD panels 410R, 410G, and 410B to modulate R, G, and B beams, respectively. Reference numeral 421 denotes a synthesizing prism to combine the modulated R, G, and B beams into one. The LCD panels 410, may be for example, 1 inch wide and long compact liquid crystal panels. The illumination units 400 are installed with respect to the respective LCD panels 410R, 410G, and 410B so as to illuminate the LCD panels 410R, 410G, and 410B, respectively. It is preferable that the illumination units 400 irradiate the R, G, and B beams onto the LCD panels 410R, 410G, and 410B, respectively.

Figure 16:
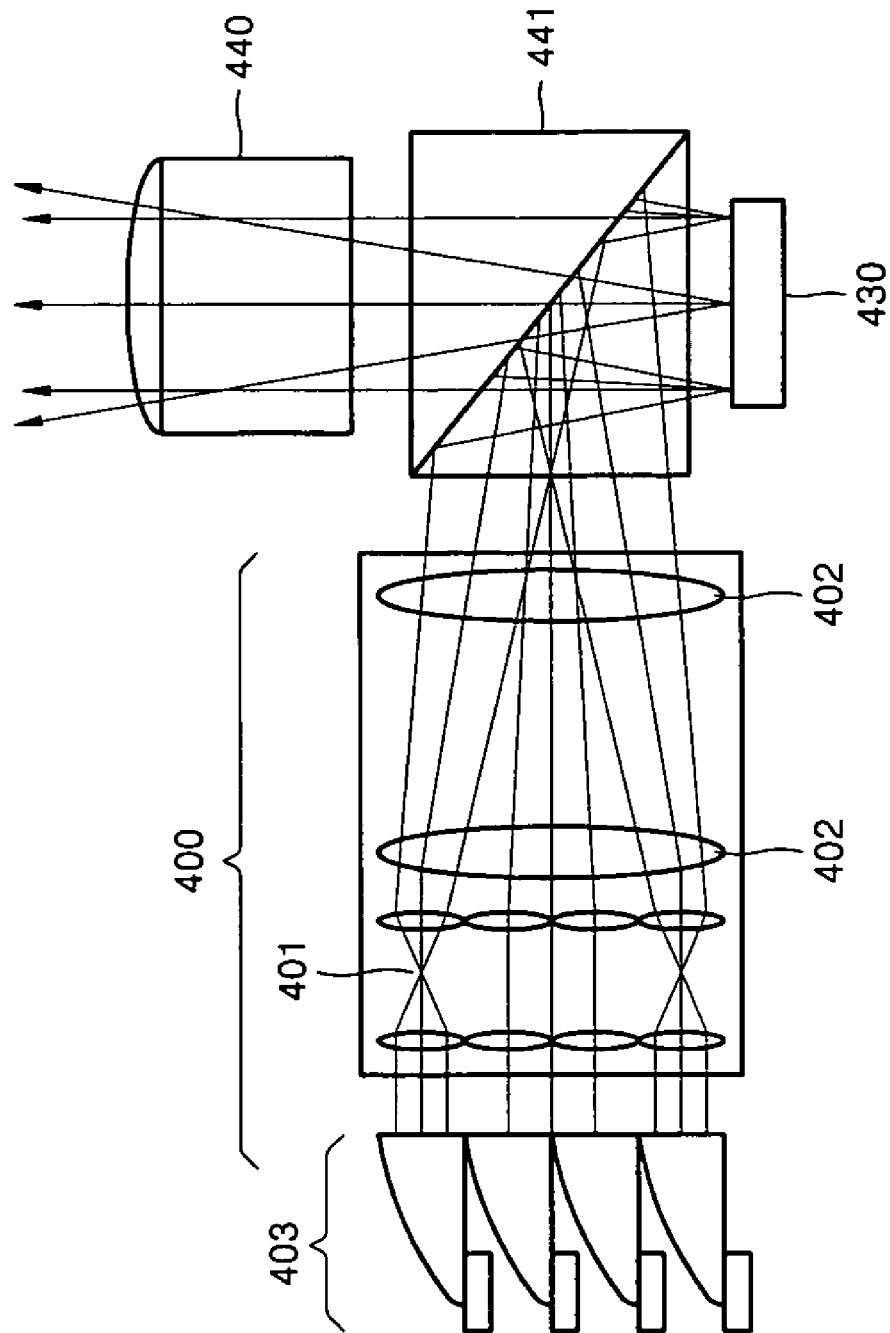

FIG. 16 is a schematic view of a projection display, according to another embodiment of the present invention. In the present embodiment, the projection display adopts a reflective optical modulator.

Referring to FIG. 16, the projection display includes a digital micromirror device (DMD) 430 which is a reflective optical modulator, an illumination unit 400 which illuminates the DMD 430, and projection optics 440 which magnifies and projects light beams modulated by the DMD 430. In the present embodiment, the projection display uses one DMD 430 to sequentially modulate R, G, and G image signals. In this case, the illumination unit 400 sequentially radiates the R, G, and B beams onto the DMD 430. Reference numeral 441 denotes a total internal reflection (TIR) prism which reflects a light beam emitted from the illumination unit 400 toward the DMD 430 and transmits the light beam modulated by the DMD 430 toward the projection optics 440.

The illumination units 400 of FIGS. 15 and 16 include light sources 403 and integrators 401 which make the intensities of light beams radiating from the light sources 403 uniform, so as to uniformly illuminate the entire optical modulators 410 and 430. The illumination units 400 may further include relay lenses 402 which guide light beams emitted from the integrators 401 to the optical modulators 410 and 430. The integrators 401 may be fly-eye lenses, rectangular parallelepiped glass rods, rectangular parallelepiped optical tunnels and internal reflective surfaces, or the like.

The compact light source modules shown in FIGS. 5 through 13 may be used as the light sources 403. When one compact light source module radiates an amount of light sufficient for the projection display, the one compact light source module may replace the light sources 403. However, the compact light source module generally radiates a smaller amount of light than a metal halide lamp or a super-high voltage mercury lamp. Therefore, it is preferable, but not necessary, that the light sources 403 are a two-dimensional array of a plurality of compact light source modules. Hereinafter, for convenience sake, a compact light source module 501 or 502 shown in FIG. 11 or 13 will be described.

Figure 17:
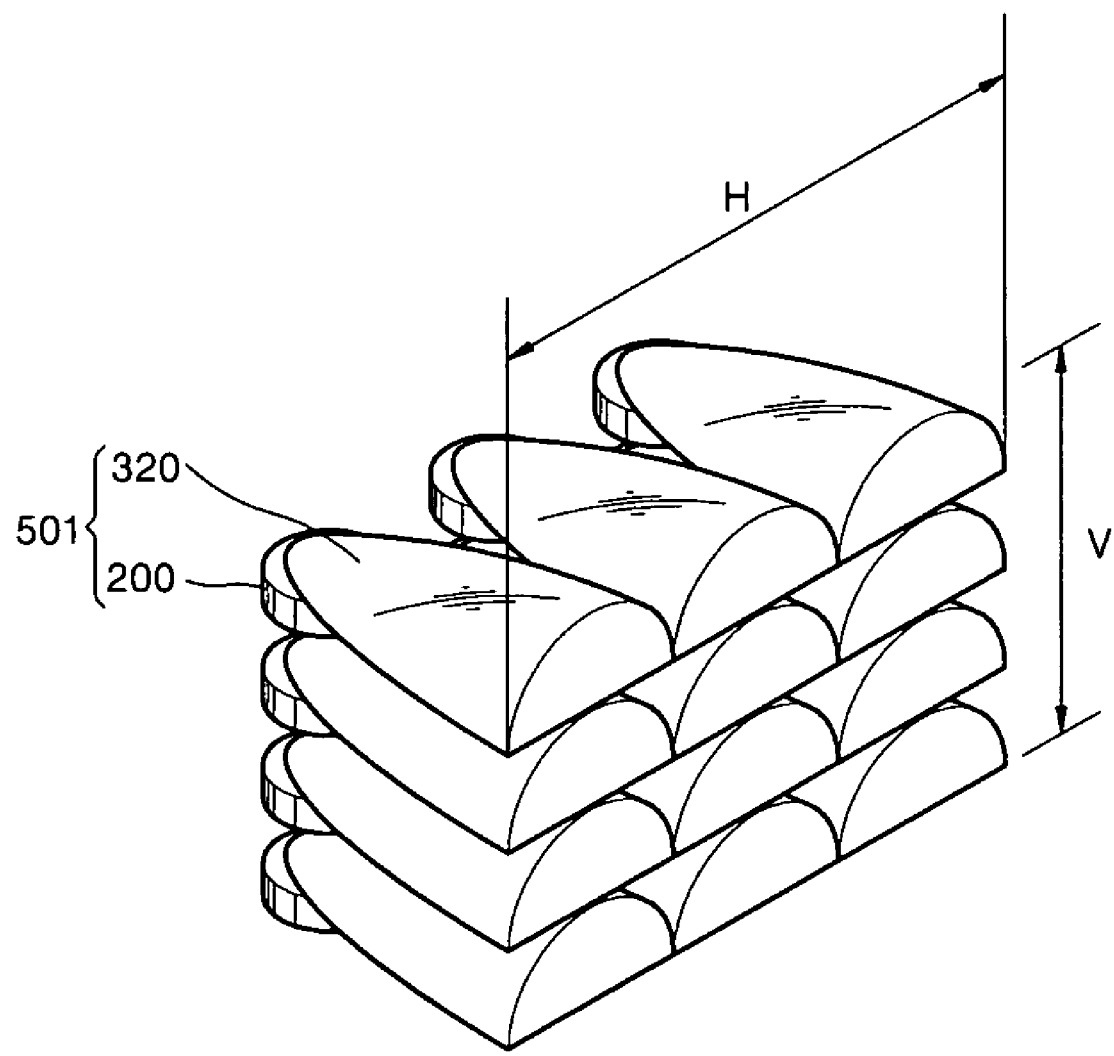
FIGS. 17 through 20 are views showing various types of arrays of compact light source modules, according to different embodiments of the present invention.

FIGS. 17 through 20 show various types of arrays of light source modules. Referring to FIG. 17, three compact light source modules 501 are arrayed in four rows. Here, an aspect ratio H:V of an aperture of the array of compact light source modules 501 is preferably equal to an aspect ratio of an aperture of the optical modulators 410 and 430.

Figure 18:
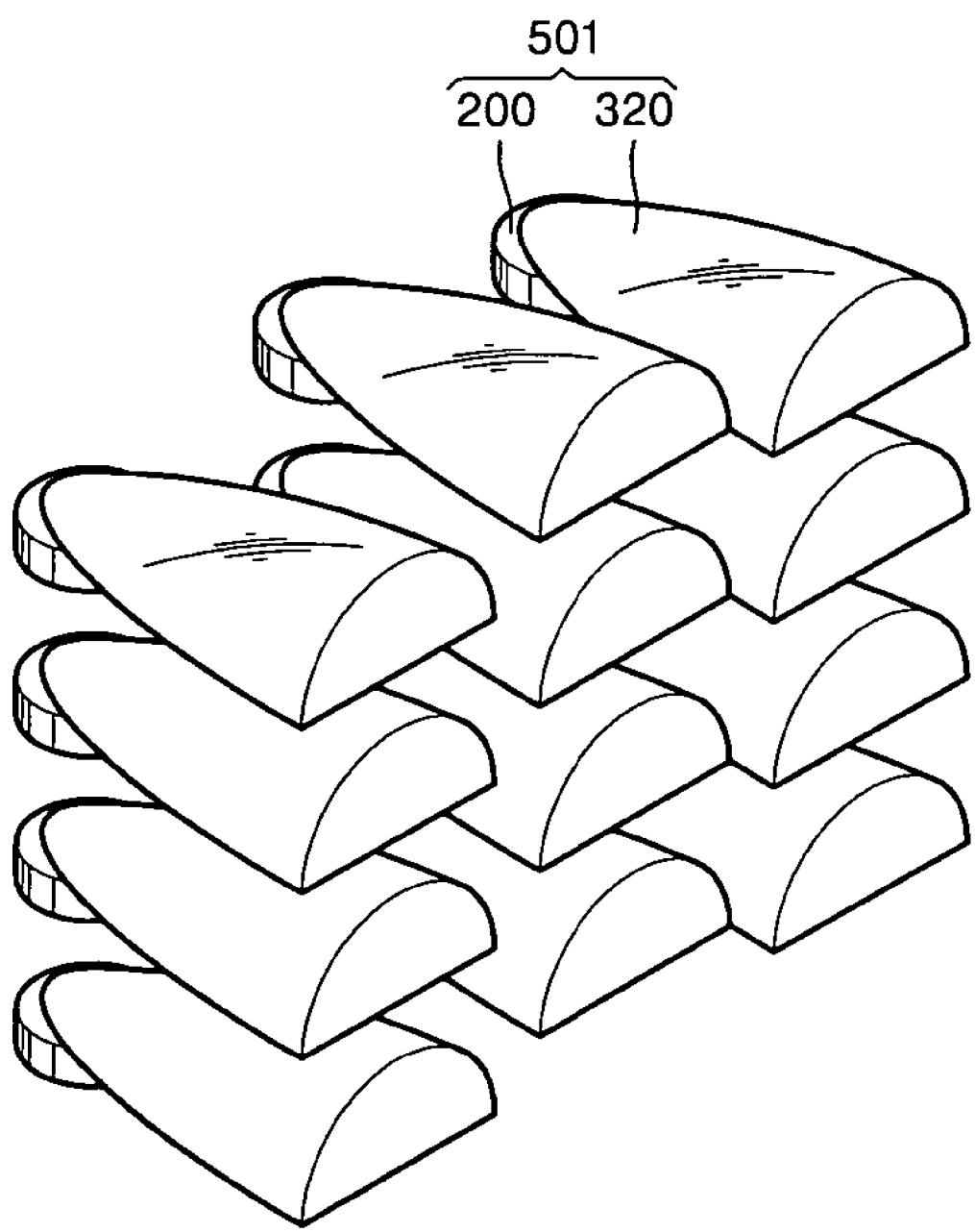

Referring to FIG. 18, compact light source modules 501 are arrayed so that compact light source modules 501 in an upper row overlap a portion of compact light source modules 501 in a lower row. In other words, the compact light source modules 501 zigzag. As a result, this structure can contribute to obtaining uniform illumination light.

Figure 19:
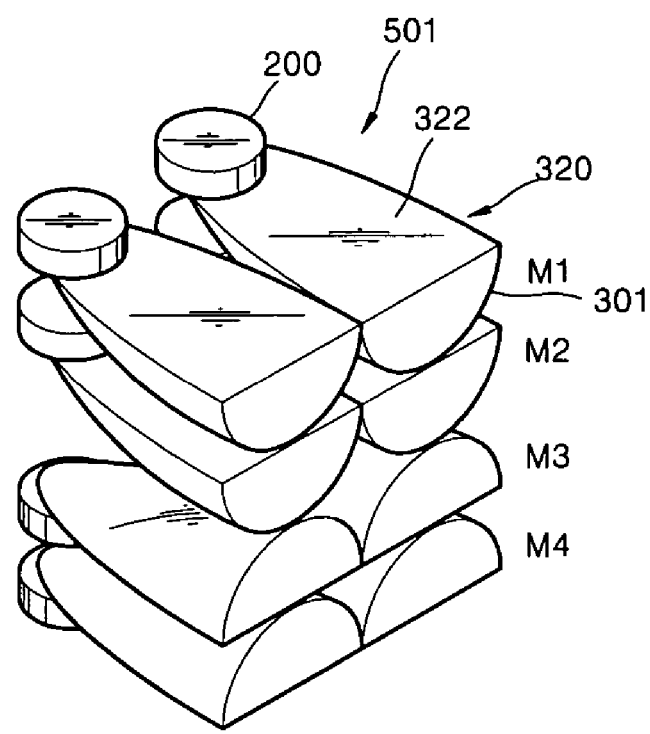

Referring to FIG. 19, compact light source modules 501 are arrayed so that the first reflective surfaces 301 of the collimators 320 in two upper rows M1 and M2 face the first reflective surfaces 301 of the collimators 320 in two lower rows M3 and M4. Thus, uniform illumination light can be obtained due to this structure. Also, since the parabolic first reflective surfaces 301 face inward and the plane second surfaces 322 face outward, illumination light having the same aspect ratio as the aspect ratio of the optical modulators 410 and 430 can be obtained.

Figure 20:
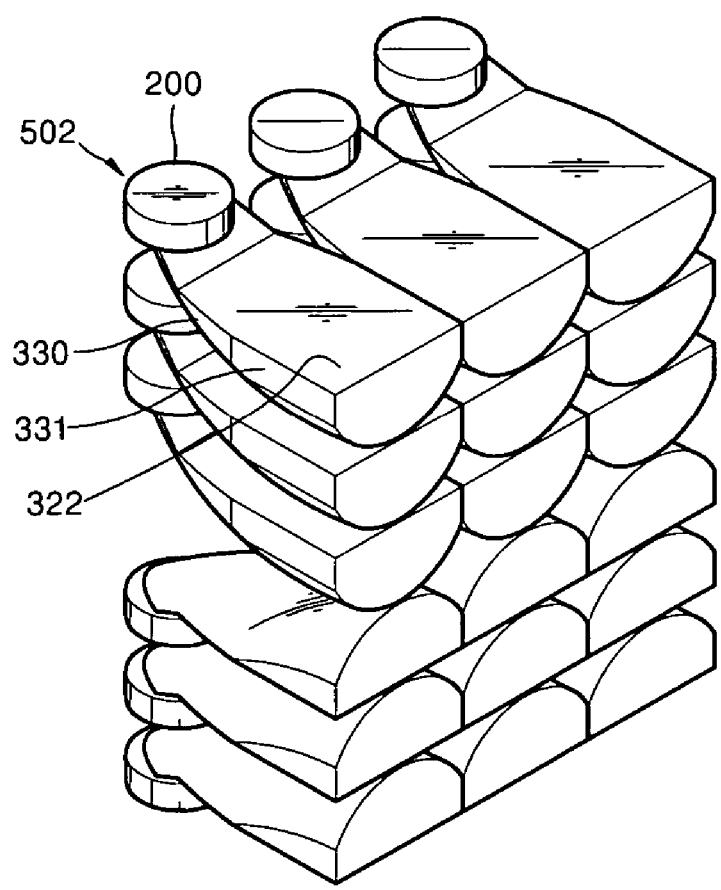

As can be seen in FIG. 20, three compact light source modules 502 are arrayed in six rows. The compact light source modules 502 in each row are arrayed so that the adherent surfaces 331 of the collimators 330 adhere closely to one another. In addition, the parabolic first reflective surfaces 301 face inward, and the plane second surfaces 322 face outward. Thus, the second surfaces 322 are located at the upper and lower sides of the array of compact light source modules 502, and the adherent surfaces 331 are located at the right and left sides of the array of compact light source modules 502. As a result, the array of compact light source modules 502 has a rectangular shape. This structure can contribute to obtaining illumination light having the same aspect ratio as the aspect ratio of the aperture of the optical modulators 410 and 430.

In the embodiments of FIGS. 17 through 20, collimators of compact light source modules in the same row may form a signal body. In this case, the compact light source modules are arrayed as shown in FIG. 20. Also, the compact light source modules shown in FIGS. 8 and 12 have the apertures with lower aspect ratios than the aspect ratio of the apertures of the compact light source modules shown in FIGS. 5, 6, 7, 9, 10, 11, and 13. Accordingly, when compact light source modules as shown in FIGS. 8 and 12 are arrayed, a larger number of compact light source modules may be arrayed than when compact light source modules as shown in FIGS. 5, 6, 7, 9, 10, 11, and 13 are arrayed. As a result, brighter illumination light can be obtained.

Figure 21:
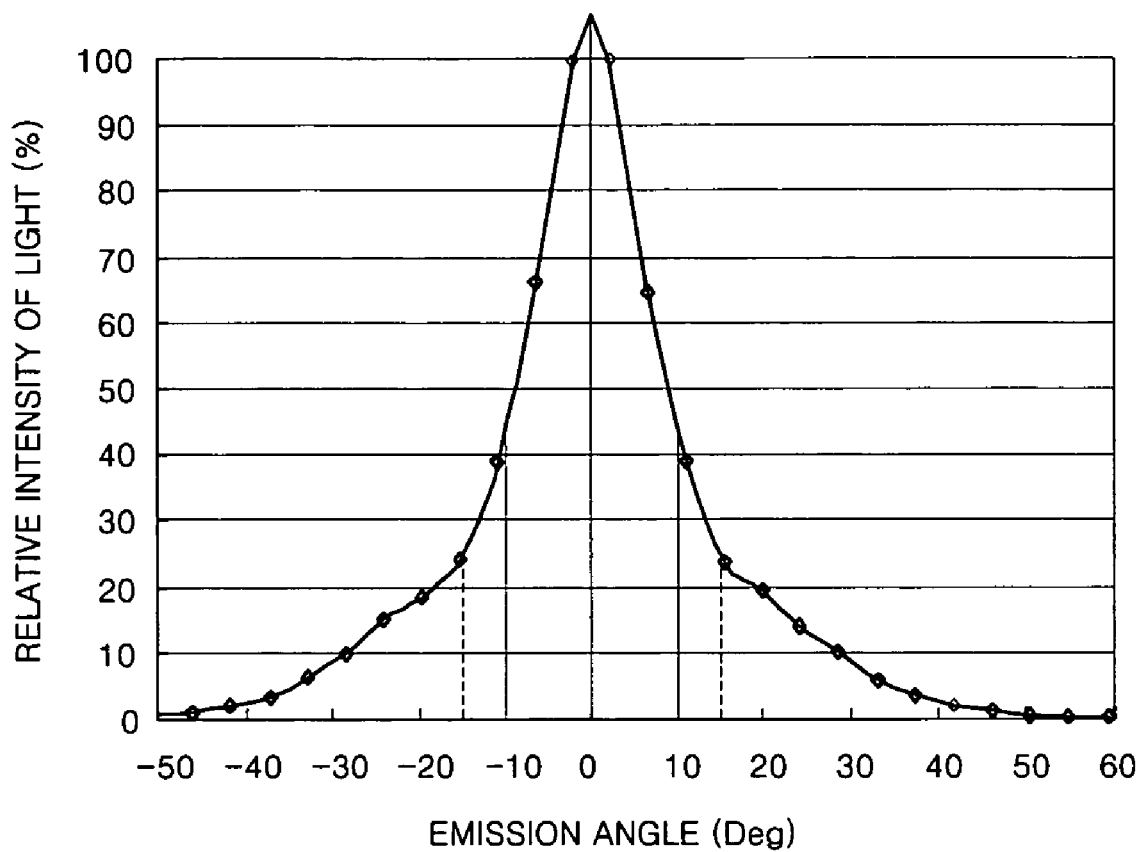
FIG. 21 is a graph showing the result of a simulation of a light intensity distribution with respect to an emission angle of a light beam emitted from an array of light source modules of FIG. 20.

FIG. 21 is a graph showing the result of a simulation of the relative intensity of light with respect to an emission angle of a light beam emitted from the array of light source modules of FIG. 20. As can be seen in FIG. 21, the light beam with the relative light intensity of about 25% is concentrated within the emission angle of ±15°. Therefore, additional secondary optics does not need to be used for collimating.

As described above, in a projection display using a compact light source module, according to the present invention, a light beam can radiate from the compact light source module at an effective radiation angle so as to efficiently illuminate the optical modulators 410 and 430. Thus, since the projection display does not require secondary optics used for collimating, an illumination unit can be quite simplified. Also, deterioration of the light condensing efficiency caused by the fundamental limitation of an optical system in using a lens can be avoided. Therefore, light efficiency can be improved.

Moreover, the compact light source module can include a parabolic first reflective surface to collimate a light beam radiating from a light source so as to efficiently illuminate an object at a radiation angle. Furthermore, the compact light source module can include a second reflective surface to minimize loss of light so as to improve light efficiency. The compact light source module can further include a third reflective surface to reflect a light beam, which radiates from the light source at a radiation angle so as not to be incident on the first reflective surface, toward the first reflective surface. Thus, light collimating efficiency can be improved. In addition, the second reflective surface may incline to realize a compact light source module with an aperture of a small size. As a result, a larger number of compact light source modules can be arrayed in a predetermined space, and thus brighter illumination light can be obtained.

Also, a collimator can be filled with a coolant to prevent the radiation characteristics of the light source from deteriorating due to heat. The collimator can be formed of a transparent body to achieve matching of refractive indexes. When the light source modules are arrayed, a plurality of collimators may form a single body or may have the same aspect ratio as optical modulators. The compact light source modules of the present invention are applicable to various types of illumination devices such as a projection display, an electric light panel, a backlight panel of a flat panel display (FPD), etc.

The projection display of the present invention does not need to include secondary optics. Thus, an illumination unit can be simplified and light efficiency can be improved. Since the light source has a relatively longer life span than a metal halide lamp or a super-high voltage mercury lamp, the light source does not need to be frequently replaced with new one. As a result, the projection display can be simplified.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A compact light source module comprising:
a compact light source; and
a collimator which comprises,
a parabolic first reflective surface to reduce a radiation angle at which a light beam radiates from the compact light source, so as to emit the light beam through a side aperture, and a second reflective surface which is located under the first reflective surface and comprises an incident portion through which the light beam radiates from the compact light source, wherein the compact light source is located in the vicinity of a focal point of the first reflective surface, and wherein the compact light source has an optical axis which is directed at the first reflective surface.

2. The compact light source module of claim 1, wherein the compact light source has an optical axis and is arrayed so that the optical axis is perpendicular to a principal axis of the first reflective surface.

3. The compact light source module of claim 1, wherein the second reflective surface inclines with respect to the principal axis of the first reflective surface at an inclination angle so that the size of the side aperture is reduced, and the compact light source is disposed so that its optical axis inclines with respect to the principal axis at the same inclination angle as the inclination angle of the second reflective surface.

4. The compact light source module of claim 1, wherein the collimator further comprises a third reflective surface at an edge of the incident portion to reflect, toward the first reflective surface, a light beam which radiates from the compact light source at a greater radiation angle than an aperture angle of the side aperture.

5. The compact light source module of claim 1, wherein an internal space between the first and second reflective surfaces is filled with a coolant.

6. The compact light source module of claim 1, wherein the collimator has a transparent body which comprises a parabolic outer surface, a plane lower surface, and a side surface to emit a light beam, the parabolic outer surface and the plane lower surface being coated with a reflective material except the incident portion to form the first and second reflective surfaces.

7. The compact light source module of claim 6, wherein the collimator comprises two sides which respectively are plane adherent surfaces.

8. The compact light source module of claim 6, wherein the collimator further comprises an incline plane to form a boundary between the lower surface and the incident portion, the incline plane being coated with a reflective material to form a third reflective surface which reflects, toward the first reflective surface, a light beam which radiates from the compact light source at a greater radiation angle than an aperture angle of the side aperture.

9. The compact light source module of claim 8, wherein the collimator comprises two sides which respectively are plane adherent surfaces.

10. The compact light source module of claim 1, further comprising a reflective index matching member disposed between the compact light source and the collimator, wherein a reflective index of the reflective index matching member is smaller than that of the compact light source and greater than that of the collimator.

11. A projection display comprising an illumination unit, an optical modulator to modulate a light beam radiating from the illumination unit to be suitable for image data, and projection optics to magnify and project the light beam emitted from the optical modulator, the illumination unit comprising:

at least one compact light source module that comprises a compact light source and a collimator, said collimator comprising, a parabolic first reflective surface to reduce a radiation angle at which a light beam radiates from the compact light source, so as to emit the light beam through a side aperture, and a second reflective surface which is located under the first reflective surface and comprises an incident portion through which the light beam radiates from the compact light source, wherein the compact light source is located in the vicinity of a focal point of the first reflective surface, and wherein the compact light source has an optical axis which is directed at the first reflective surface.

12. The projection display of claim 11, wherein the compact light source has an optical axis and is arrayed so that the optical axis is perpendicular to a principal axis of the first reflective surface.

13. The projection display of claim 11, wherein the second reflective surface inclines with respect to the principal axis of the first reflective surface at an inclination angle so that the size of the side aperture is reduced, and the compact light source is disposed so that its optical axis inclines with respect to the principal axis at the same inclination angle as the inclination angle of the second reflective surface.

14. The projection display of claim 11, wherein the collimator further comprises a third reflective surface at an edge of the incident portion to reflect, toward the first reflective surface, a light beam which radiates from the compact light source at a greater radiation angle than an aperture angle of the side aperture.

15. The projection display of claim 11, wherein an internal space between the first and second reflective surfaces is filled with a coolant.

16. The projection display of claim 11, wherein the collimator has a transparent body which comprises a parabolic outer surface, a plane lower surface, and a side surface to emit a light beam, the parabolic outer surface and the plane lower surface being coated with a reflective material except the incident portion to form the first and second reflective surfaces.

17. The projection display of claim 16, wherein the collimator comprises two sides which respectively are plane adherent surfaces.

18. The projection display of claim 16, wherein the collimator further comprises an incline plane to form a boundary between the lower surface and the incident portion, the incline plane being coated with a reflective material to form a third reflective surface which reflects, toward the first reflective surface, a light beam which radiate from the compact light source at a greater radiation angle than an aperture angle of the side aperture.

19. The projection display of claim 18, wherein the collimator comprises two sides which respectively are plane adherent surfaces.

20. The projection display of claim 11, wherein the compact light source module further comprises a reflective index matching member disposed between the compact light source and the collimator, a reflective index of the reflective index matching member is smaller than that of the compact light source and greater than that of the collimator.

21. The projection display of claim 11, further comprising a plurality of compact light source modules which are two-dimensionally arrayed.

22. The projection display of claim 21, wherein the plurality of compact light source modules are arrayed so that an aspect ratio of an aperture of the plurality of compact light source modules is equal to an aspect ratio of an aperture of the optical modulator.

23. The projection display of claim 21, wherein compact light source modules in a row are arrayed among compact light source modules in an adjacent row.

24. The projection display of claim 21, wherein collimators of a plurality of compact light source modules in a row form a single body.

25. A compact light source module comprising:
   a compact light source; and
   a collimator comprising a parabolic first reflective surface to reduce a radiation angle at which a light beam radiates from the compact light source, so as to emit the light beam through a side aperture,
   wherein the compact light source is located in the vicinity of a focal point of the first reflective surface, and
   wherein the compact light source has an optical axis which is directed at the first reflective surface.

26. A projection display comprising an illumination unit, an optical modulator to modulate a light beam radiating from the illumination unit to be suitable for image data, and projection optics to magnify and project the light beam emitted from the optical modulator, the illumination unit comprising:
   a compact light source; and
   a collimator comprising a parabolic first reflective surface to reduce a radiation angle at which a light beam radiates from the compact light source, so as to emit the light beam through a side aperture,
   wherein the compact light source is located in the vicinity of a focal point of the first reflective surface, and
   wherein the compact light source has an optical axis which is directed at the first reflective surface.

* * * * *